United States Patent [19]

Ma et al.

[11] Patent Number: 4,709,409
[45] Date of Patent: Nov. 24, 1987

[54] TVRO RECEIVER WITH SURFACE MOUNTED HIGH FREQUENCY VOLTAGE-CONTROLLED OSCILLATOR

[76] Inventors: John Y. Ma, 499 Dundee Ave., Miliptas, Calif. 90535; Leo Wu, 1507 Oak Canyon Dr., San Jose, Calif. 95120

[21] Appl. No.: 899,830

[22] Filed: Aug. 25, 1986

[51] Int. Cl.[4] .......................... H04B 1/26; H03B 5/12
[52] U.S. Cl. .................................... 455/325; 455/318; 455/327; 331/107 DP; 331/177 V
[58] Field of Search ........................... 358/191.1, 188; 331/107 DP, 107 SL, 177 V; 455/327, 325, 318

[56] References Cited

U.S. PATENT DOCUMENTS

| | | | |
|---|---|---|---|
| 3,407,363 | 10/1968 | Kaiser et al. | 331/177 V |
| 3,569,865 | 3/1971 | Healey, III | 331/177 V |
| 3,579,115 | 5/1971 | Goncharoff et al. | 455/318 X |
| 3,671,868 | 6/1972 | Sanders | 455/325 X |
| 3,982,211 | 9/1976 | Endersz | 331/107 DP X |
| 4,340,975 | 7/1982 | Onishi et al. | 455/327 X |
| 4,494,081 | 1/1985 | Lea et al. | 331/177 V |
| 4,500,854 | 2/1985 | Meyer | 331/107 SL X |
| 4,523,159 | 6/1985 | Dobrovolny | 455/327 X |
| 4,619,001 | 10/1986 | Kane | 455/318 X |
| 4,641,369 | 2/1987 | Grote et al. | 455/327 |

Primary Examiner—Michael A. Masinick
Assistant Examiner—E. Anne Faris
Attorney, Agent, or Firm—Stephen G. Rudisill

[57] ABSTRACT

A TVRO receiver utilizes an improved voltage-controlled oscillator (VCO) of the surface mounted type which has a wide bandwidth of operation extending into the microwave frequency range. The VCO comprises a dielectric substrate with a patterned-metal layer on one side and a surface mounted oscillator on the patterned-metal side of the substrate. The oscillator comprises amplifying means which produce an oscillating output by the use of regenerative feedback means including an open-circuit-stub inductance formed in the patterned metal layer, and a tunable resonant circuit coupled to the amplifying means in order to control the frequency of the oscillating output. The resonant circuit includes a short-circuit-stub capacitance formed within the patterned middle layer, at least one variable capacitance diode in series with the short-circuit stub, and means for applying a controllable tuning potential to the resonant circuit.

15 Claims, 3 Drawing Figures

TVRO RECEIVER WITH SURFACE MOUNTED HIGH FREQUENCY VOLTAGE-CONTROLLED OSCILLATOR

FIELD OF THE INVENTION

The present invention relates generally to television receive only receivers, which are commonly known as "TVRO's" and used for receiving audio/video transmissions broadcast over a network of earth satellites. This invention particularly relates to a TVRO receiver utilizing a tuner system with an improved voltage controlled oscillator (VCO) of the surface mounted type which has a wide bandwidth of operation extending into the Gigahertz range of microwave frequencies.

BACKGROUND OF THE INVENTION

TVRO receivers capable of receiving satellite television signals typically comprise a reception antenna for capturing satellite signals broadcast by orbiting satellites in conventional satellite communication network systems, a television tuner, a terrestrial interference filter if required, an IF demodulator, and a conventional video/audio monitor for the reproduction of the received satellite signals. The tuner constitutes a critical component of the overall TVRO system since it functions to process the accepted signals in order to select or "tune" to a particular channel and generate the appropriate intermediate frequency (IF) output. Although voltage-controlled oscillators for electronic communication devices typically operate in the Megahertz range, the increasing number of television channels operating at frequencies extending into the Gigahertz range have turned up a need for VCO's that operate efficiently at higher frequency ranges, including the microwave frequency range.

VCO's that do operate in the microwave range are available but are quite expensive and are generally incapable of being conveniently tuned over a wide range of frequencies in the Gigahertz range. Such VCO's also involve complex manufacturing processes since they include a number of discrete, lumped components and do not permit easy surface mounting of the components over conventional printed circuit boards (PCB's). Further, the cost of a conventional microwave VCO increases considerably if a tight range of tolerance values is required for the tuning components of the VCO.

SUMMARY AND OBJECTS OF THE INVENTION

Accordingly, it is a primary object of the present invention to provide an improved voltage-controlled oscillator for use with TVRO's, which is tunable over a wide bandwidth in the upper microwave frequency range.

Another important object of this invention is to provide a voltage-controlled oscillator of the above kind which allows maintenance of a tight tolerance on the tuning elements.

Another related object of this invention is to provide a voltage-controlled oscillator which can be fabricated on printed circuit boards using a small number of surface mounted components in a compact area.

A further object of the invention is to provide such an improved voltage-controlled oscillator which is conveniently tunable over a selected bandwidth within a wide range of frequencies.

Yet another object of this invention is to provide an improved VCO of the above kind in an economical form which is easily manufactured and yet provides reliable operation over a prolonged operating life.

Other objects and advantages will be apparent from the following detailed description taken in conjunction with the accompanying drawings.

DESCRIPTION OF THE PREFERRED EMBODIMENT

While the invention will be described in connection with certain preferred embodiments, it will be understood that it is not intended to limit the invention to these particular embodiments. On the contrary, it is intended to cover all alternatives, modifications and equivalent arrangements as may be included within the spirit and scope of the invention as defined by the appended claims.

Figure 1:
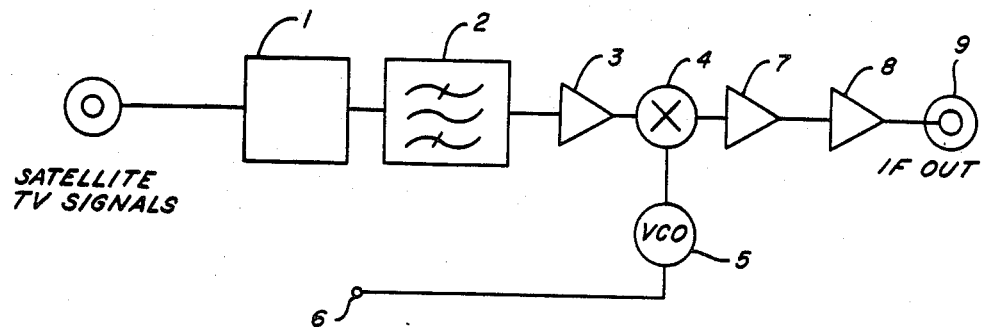
FIG. 1 is a simplified block diagram of a typical tuner system for use with conventional TVRO receivers.

Turning now to the drawings and referring to FIG. 1, there is shown a simplified block diagram of a typical tuner system for use with TVRO receivers. The tuner generally includes means 1 for selectively isolating either the vertically polarized or horizontally polarized signals received by an earth station antenna. The antenna is preferably equipped with a low noise block converter generating output signals within the 0.95 to 1.45 GHz frequency band. The output of the isolating means 1, which is still a wideband signal, is processed by the remainder of the tuner system to select a particular channel for use in generating a television picture with accompanying sound in a display device, such as a standard television set or monitor. The wideband output signal is passed through a band pass filter 2 (e.g., having a 50 to 500 MHz pass band) to a superheterodyne IF converter which includes a preamplifier 3 that receives the output from the filter 2 and amplifies that output to a desired input level for a mixer 4.

The mixer 4 combines the incoming wideband signal with the output signal from a local voltage-controlled oscillator 5 to reduce the frequency of the wideband signal to an IF band in the UHF range. For example, the local oscillator typically produces an output signal in the frequency range of 1.43 to 2.23 GHz, thereby producing an IF output from the mixer 4 at a frequency of 480 MHz. The local oscillator 5 is tuned by an adjustable d-c tuning voltage applied to an input terminal 6, thereby determining which portion of the wideband signal is converted to the IF frequency. The local oscillator forms a critical component of the tuner system, and hence the overall TVRO, since the range over which the tuner efficiently processes the accepted satellite TV signals in order to tune to any particular channel is contingent upon the tunable range of the oscillator itself.

In FIG. 1, the IF output signal from the mixer 4 is generally fed to a pair of IF amplifiers 7 and 8 which are tuned to pass only a relatively narrow frequency, e.g., a 12 to 15 MHz band, and produce the amplified IF output 9.

Figure 2:
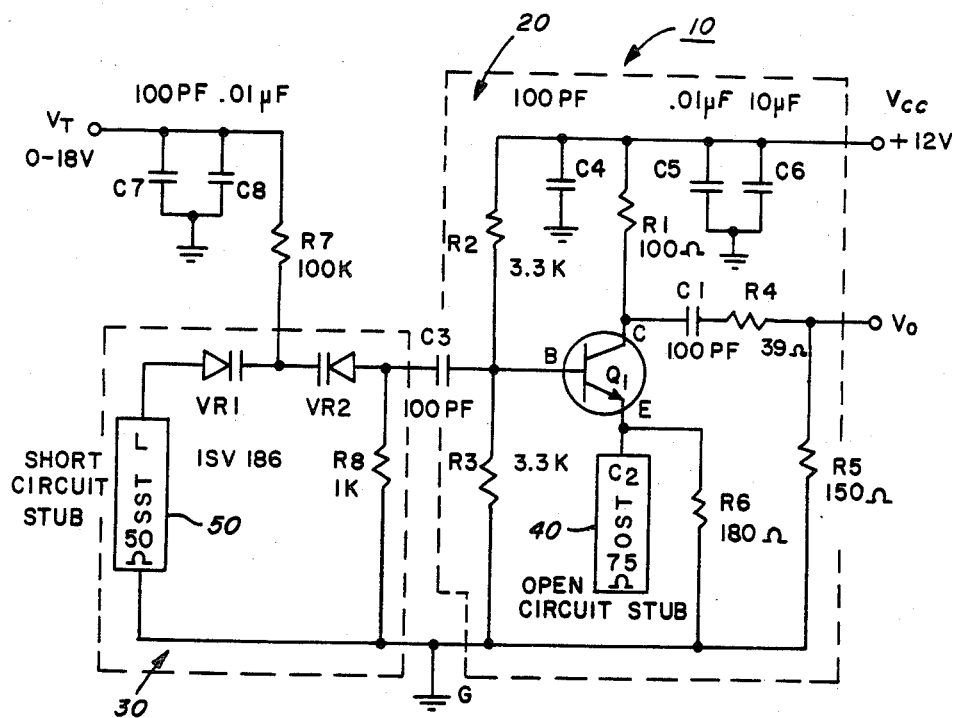
FIG. 2 is a schematic diagram of a microwave-frequency voltage-controlled oscillator embodying the present invention and usable with the TVRO tuner system of FIG. 1.

Referring now to FIG. 2, there is shown a schematic diagram of an illustrative VCO according to the present invention. The VCO 10 essentially comprises an amplifier 20 and a tunable resonant circuit 30. The amplifier includes a bi-polar NPN transistor Q1 which is provided with a positive operating voltage $+V_{CC}$ at its collector C through a supply resistor R1. A portion of the supply voltage is also applied through a voltage-divider network consisting of serial resistors R2 and R3 to the base B of the transistor Q1. The voltage applied through the voltage divider biases the transistor Q1 in such a way that it functions as an amplifier. The collector C of the transistor Q1 is coupled to a common potential or ground G through a serial connection of a capacitance C1 and a pair of resistances R4 and R5. The emitter E of Q1 is coupled to ground G through a resistance R6, and is also connected to an open-circuit stub capacitance 40 whose function and importance in the operation of the VCO will be discussed in detail below.

The bias voltage to the transistor Q1 is selected in such a way that Q1 functions in its active operating region and provides a voltage gain which substantially exceeds unity. Oscillation of the amplifier 20 over a prescribed band of frequencies is provided by the introduction of regenerative feedback through a plurality of reactances causing the amplifier circuit to be unstable. The reactance component contributing to amplifier oscillations is a combination of the capacitance of the capacitor C1, the capacitance C2 offered by the open-circuit stub capacitance 40, the reactance offered by the internal capacitance $C_{BE}$ between the base B and the emitter E of the bi-polar transistor Q1, as well as the reactance of the controllable resonance circuit 30.

In FIG. 2, the controllable resonant circuit 30 functions to define the particular frequency at which the amplifier 20 oscillates. The resonant circuit is coupled between the base B of the bi-polar transistor Q1 and ground G, and comprises a series connection of a pair of varactor (variable capacitance) diodes VR1 and VR2 with their cathodes tied together, the capacitance C3 and a short-circuit stub inductance 50 which introduces an inductance L into the resonant circuit. The series resonant frequency of the resonant circuit 30 defines the frequency at which the amplifier 20 oscillates. The frequency of oscillation of the voltage-controlled oscillator of FIG. 1 is controlled by a positive tuning voltage $V_T$ which is applied through a limiting resistor R7 to the junction of the cathodes of the varactor diodes VR1 and VR2.

In the resonant circuit 30, the anode end of the varactor diode VR1 is connected through the capacitance C3 to the base of the transistor Q1 and is also coupled to ground through a resistance R8. The anode end of reactor diode VR2 is connected to the input end of the short-circuit stub 50 with the output end of the stub 50 being coupled to ground. This arrangement ensures that the positive tuning voltage $V_T$ is applied to the varactor diodes VR1 and VR2 in such a way that any increases or decreases in the tuning voltage $V_T$ cause corresponding increases and decreases in the respective potentials between the cathodes and the anodes of each of the varactor diodes VR1 and VR2.

At its main voltage supply end, i.e., the point of application of the voltege Vcc, the oscillator circuit of FIG. 1 is provided with a relatively low value capacitance C4 which connects the Vcc supply point to the ground G and functions as a bypass element for high frequency noise components. A pair of shunted capacitances C5 and C6 of a relatively high value also connect the Vcc supply point to ground and provide a bypass path to low frequency noise components. Similar noise protection is provided on the tuning voltage supply end of the oscillator circuit. More specifically, a relatively low value capacitance C7 connects the point of application of the tuning voltage $V_T$ to ground and provides a bypass path for high frequency noise components, while a relatively high value capacitance C8 also connects the $V_T$ to ground and functions as a bypass path for low frequency noise components.

The use of the open-circuit stub 40 and the short circuit stub 50 in order to provide controllable capacitance and inductance, respectively, for the resonant or tank circuit 30 is made on the basis that: (1) a short-circuited transmission line less than a quarter of a wavelength long behaves as a pure inductance, and (2) an open circuited transmission line less than a quarter of a wavelength long behaves as a pure capacitance. More specifically, a piece of transmission line which is a quarter of a wavelength long and short circuited at the far end or which is half a wavelength long and open circuited at the far end, looks like an open circuit, and behaves like a parallel tuned circuit. For such a transmission line, if the frequency of operation is lowered, the resulting shunt inductance reactance of the circuit is lower and the shunt capacitance reactance is higher causing the inductive current to predominate, thereby resulting in the impedance being purely inductive. On a similar basis, if the same quarter wavelength transmission line is open circuited, capacitive current predominates and therefore the impedance of the circuit is purely capacitive.

The use of such open-circuit stubs and short-circuit stubs as the controlling or tuning elements in the oscillator circuit constitutes a significant improvement since the stubs may be conveniently located on the printed circuit board (PCB) on which the oscillator circuit is based by defining appropriate patterned metal layers on the dielectric substrate of the PCB. This arrangement circumvents the various problems which accompany the use of lumped components particularly at the extremely high frequencies (in the Gigahertz range) for which the illustrative oscillator is designed. Another advantage of having the tuning inductance and capacitance components in the form of transmission line stubs defined on the PCB is the possibility of having extremely tight tolerances on the critical parameters of the stubs without foregoing economic considerations. In particular, the capacitance value between the collector C of the transistor Q1 and ground G requires a tight capacitive tolerance since it controls the regenerative feedback in the oscillator. The use of a traditional lumped capacitance component with tight tolerances entails prohibitive cost and the use of the open-circuit stub to provide the capacitance for the regenerative feedback conveniently provides stricter tolerance without being expensive. A further advantage accrues from the use of the transmission line stubs due to their inherent property of being conveniently tunable over a broad band of frequencies, particularly in the high frequency range. This property, for instance, allows the open-circuit stub 40 to be used to provide an extended range of negative feedback which in turn results in an extended range of the frequencies of oscillation available for the VCO. Similarly, the short-circuit stub 30 provides a wide range over which its inductance may be varied and thereby provides further extension of the range of oscillation frequencies for the VCO.

Returning now to FIG. 2, it should be noted that because of its connection through resistor R8, the anode of the varactor diode VR1 is substantially at the ground potential. Under this condition, the same positive tuning potential $V_T$ is applied across each of the varactor diodes VR1 and VR2. Hence, the capacitance offered by the varactor diodes VR1 and VR2, which is inversely proportional to the potential difference applied across their ends, varies inversely with variations in the tuning potential $V_T$. More specifically, when the tuning potential $V_T$ is set at its minimum value, the varactor diodes VR1 and VR2 each receive a corresponding minimum driving potential and hence exhibit maximum capacitance, thereby making the resonant circuit 30 function at its minimum resonant frequency. Under such conditions, the amplifier 20 also oscillates at its minimum frequency. Similarly, when the tuning potential $V_T$ is set to its maximum value, the varactor diodes VR1 and VR2 each receive maximum applied potential and offer their minimum capacitance into the resonant circuit, thereby causing it to function at its maximum frequency. Under such conditions, the amplifier 20 also oscillates at its maximum frequency. Hence, the illustrative oscillator of FIG. 2 can be made to oscillate at a desired frequency within a prescribed band of frequencies by properly controlling variations in the tuning potential $V_T$.

In order to specifically tune the frequency of oscillations of the VCO to a particular band of frequencies within its overall broad-band tunable range, the reactance offered by the resonant circuit has to be controllably adjusted. More specifically, one of the conductances or capacitances of the resonant circuit has to be adjusted in order to bring about the desired change in the frequency of oscillations. In the illustrative embodiment of FIG. 2, the inductive component of the resonant circuit is represented by the short-circuit stub 50 and hence the overall inductance L of the resonant circuit 30 may be conveniently varied by controllably adjusting the length of the short circuit stub 50. The short-circuit stub 50 also introduces a high quality-factor Q into this resonant circuit and as described above provides a means for conveniently and economically adjusting the overall inductance of the resonant circuit.

The relationship between the magnitude of the positive tuning potential $V_T$ and the frequency at which the output of the oscillator oscillates is adjustable by varying the overall capacitive component of the illustrative circuit. According to this invention, this variation is provided by the open-circuit stub 40, which lies in the regenerative feedback path. The stub 40 thus serves as a means for feedback tuning by determining the negative impedance looking into the transistor Q1, which in turn directly impacts the overall frequency range and power output of the oscillator.

According to another feature of this invention, the output of the oscillator is extracted from the collector end C of the bi-polar transistor Q1 at the junction of resistances R4 and R5, with the resistance R4 acting as a suitable buffer element. This arrangement enhances the overall quality factor Q of the oscillator, since the resonant circuit 30 is not loaded in any way by extracting the oscillating output at the collector C of the transistor Q1.

According to this invention, the bi-polar transistor Q1 is chosen to have a broad range of negative-impedance, which includes a negative resistance as well as a capacitance. The broad range of the capacitance of the bi-polar transistor Q1, in combination with the range of variation in the junction capacitance of the varactor diodes VR1 and VR2 provides a sufficiently broad tuning range for the oscillator. The illlustrative voltage controlled oscillator, as embodied in the schematic of FIG. 2, thus provides an output signal which can be conveniently controlled to oscillate within a wide band of frequencies in the microwave range. The overall frequency range is determined by the particular values of the inductance L and the capacitance C2 offered by the short-circuit stub 50 and open-circuit stub 40, respectively, as determined by their respective lengths. Variation in the frequency of oscillations of the VCO output signal within a particular range defined by the open-circuit stub and the short-circuit stub 50 are controlled by the variation in the capacitance values offered by the varactor diodes VR1 and VR2 as controlled by the positive tuning voltage $V_T$.

Figure 3:
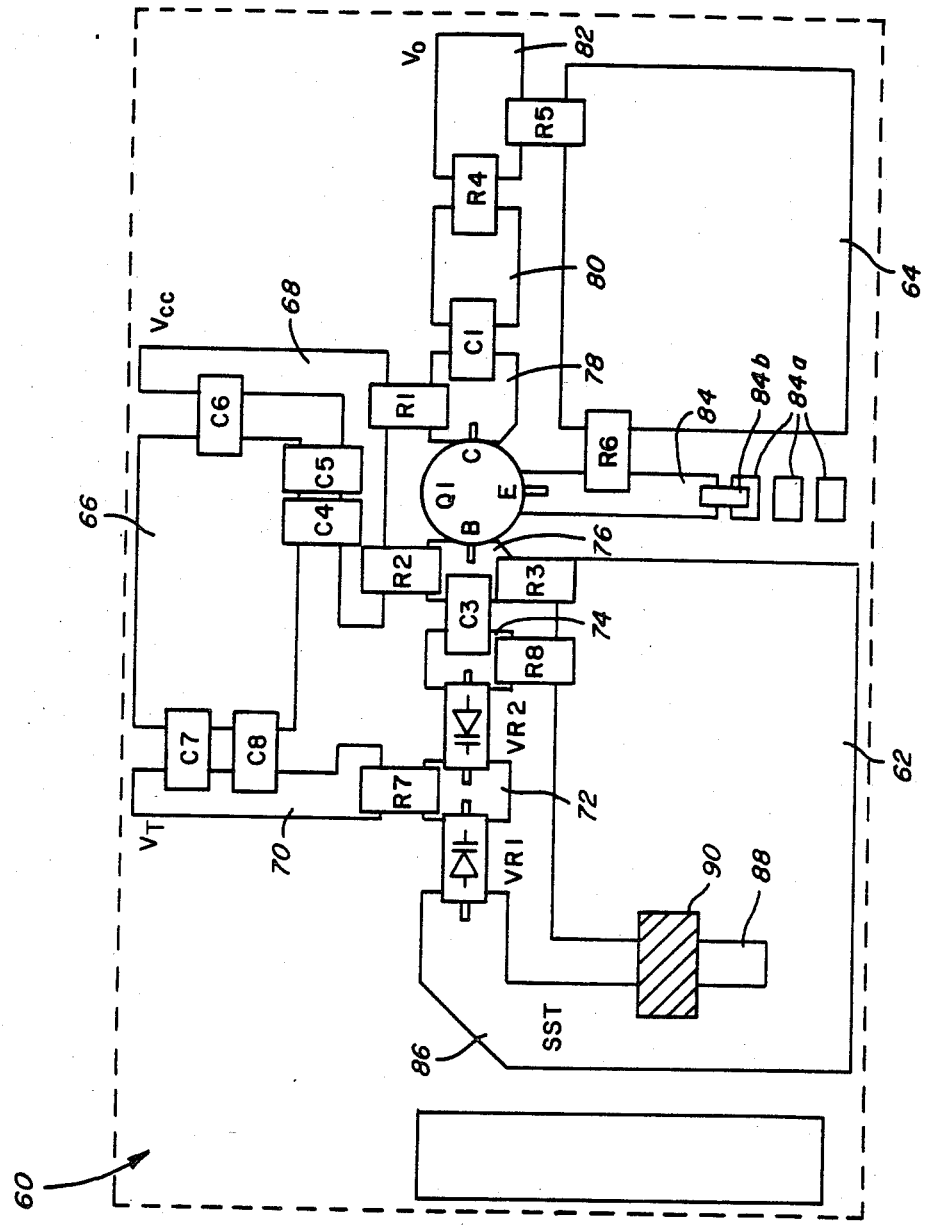
FIG. 3 is a diagrammatic representation of an illustrative PCB layout showing the surface-mounting arrangement, for the VCO according to this invention.

Referring now to FIG. 3, there is shown an illustrative PCB layout clearly showing how the various components of the voltage controlled oscillator are surface mounted onto a single PCB. The illustration shows a printed circuit board (PCB) 60 which is of conventional construction and comprises a dielectric substrate with conductive metal layers on opposite sides thereof. The conductive metal layer on one side of the board (the side shown in FIG. 3) forms a predetermined conductive pattern for interconnecting various discrete circuit components mounted on the board, while the conductive metal layer on the other side of the board forms a continuous ground plane. The patterned conductive metal layer is delineated into separate conductive areas between which the various discrete components of the oscillator are interconnected. For instance, the conductive areas 62, 64 and 66 represent the ground plane G and are tied together to the conductive metal layer forming the continuous ground plane on the other side of the PCB. The conductive metal area 68 forms a common junction for connecting the desired oscillator components to the supply voltage Vcc. A common conductive area 70 is also provided and functions as a common junction for connecting desired oscillator components to the tuning voltage $V_T$. Comparatively smaller areas 72, 74, 76, 78 and 80 are also provided on the PCB and function as conductive junctions for interconnecting desired components of the oscillator circuit. A similar conductive area 82 functions, in addition to serving as a common junction for interconnecting circuit components, as the junction from which the output $V_0$ of the oscillator is extracted.

The actual positioning of the various circuit components and their interconnections relative to the conductive areas on the PCB is self-evident from the PCB layout of FIG. 3.

FIG. 3 also illustrates clearly the physical representation of the open circuit and the short circuit stubs according to this invention. The open circuit stub (reference number 40 in FIG. 2) is located on the PCB in the form of a discrete conductive area 84 formed by an appropriately patterned middle layer on the dielectric substrate of the PCB 60. The short circuit stub (reference numeral 50 in FIG. 2) is formed on the PCB 60 by defining the conductive area 62 to include an elongated conductive section 86 extending out of and separated from the conductive area 62 by an elongated cavity 88. A conductive metallic strip 90 is positioned across the elongated cavity 88 in such a way that it bridges the elongated section 86 and the conductive area 62. It will be apparent that relative movement of the metallic strip 90 along the elongated cavity 88 varies the effective length of the short circuit stub 50 and, hence provides a convenient means for controllably adjusting the overall frequency range of the voltage controlled oscillator. In the exemplary VCO layout, it will be noted that all circuit components are conveniently mounted on one surface of the PCB and the discrete components are located relatively close to each other, thereby allowing the use of short lead lengths that avoid the generation of undesired inductive reactances which are commonly produced at high operating frequencies, particularly in the microwave range. The above arrangement also permits the surface mounting of the various discrete components of the oscillator onto a PCB having a conveniently small size. For instance, the illustrative layout of FIG. 3 may easily be accommodated onto a PCB having dimensions of 1"×1.4".

Although the illustrative VCO can be made with different combinations of values for the various components, the preferred embodiment of the illustrative circuit uses the following values to produce an output which oscillates at frequencies with a bandwidth of at least 1000 MHz within the general range of 1000–2500 MHz, in response to a tuning voltage ranging from about zero to about 20 volts.

| | | |
|---|---|---|
| $V_{cc}$ | — | 5 V + 12 V (+18 V) |
| $V_T$ | — | 0 V to 18 V |
| Q1 | — | NE02137 |
| SST(50) | — | 50 Ω, 0.2–0.4" |
| C1 | — | 100 PF |
| OST(40)-C2 | — | 75 Ω, 30° @1.2 GHz |
| C3 | — | 100 PF |
| C4 | — | 100 PF |
| C5 | — | .01 μF |
| C6 | — | 10 μF |
| C7 | — | 100 PF |
| C8 | — | .01 μF |
| $R_1$ | — | 100 Ω |
| $R_2$ | — | 3.3K Ω |
| $R_3$ | — | 3.3K Ω |
| $R_4$ | — | 39 Ω |
| $R_5$ | — | 150 Ω |
| $R_{56}$ | — | 180 Ω (270 Ω) |
| $R_7$ | — | 100K Ω |
| $R_8$ | — | 1K Ω |
| VD1, VD2 | — | ISV186 |

From the foregoing, it is apparent that the illustrative oscillator provides a wide bandwidth of operation in the microwave range while utilizing a significantly reduced number of lumped components and also permits a tighter tolerance range for the critical parameters of the oscillator. The oscillator is capable of being manufactured easily in an economical form since all its components can be surfaced mounted onto a prepatterned printed circuit board.

We claim:

1. A TVRO receiver having a heterodyne circuit for receiving incoming TV signals in the microwave frequency range and including a VCO for generating an adjustable prescribed frequency and a mixer for combining the incoming TV signals with the output of the VCO, said VCO comprising:
   a dielectric substrate with a patterned metal layer on one side of the substrate, and
   a surface-mounted oscillator on the patterned metal side of said substrate, said oscillator comprising:
   amplifying means with regenerative feedback means to produce an oscillating output, said regenerative feedback means including an open-circuit-stub capacitance formed by said patterned metal layer, and
   a controllable resonant circuit coupled to said amplifying means to control the frequency at which said output oscillates, said resonant circuit including a short-circuit-stub inductance formed by said patterned metal layer, at least one varactor diode in series with said short circuit stub, and means for applying a controllable tuning voltage to said resonant circuit.

2. The TVRO receiver of claim 1 wherein capacitance values of said open-circuit stub and said varactor diode, and an inductance value of said short-circuit stub are selected to produce a bandwidth of at least 1000 MHz within a frequency range of 1000 MHz to 2500 MHz in response to tuning voltages ranging from about about zero to about 20 volts.

3. The TVRO receiver of claim 1 wherein said amplifying means includes a transistor, said resonant circuit includes a pair of oppositely poled varactors connected in series between the base of said transistor and said short-circuit stub, and said tuning voltage is applied to a junction between the two varactors.

4. The TVRO receiver of claim 1 wherein an inductance of said short-circuit-stub inductance and a capacitance of said open-circuit-stub capacitance, formed by said patterned metal layer may be adjusted by varying respective lengths of said stubs.

5. An improved voltage controlled oscillator (VCO) capable of producing an oscillating output with a frequency bandwidth in the Gigahertz range, said oscillator comprising:
   a dielectric substrate with a patterned metal layer on one side of the substrate, and
   a surface-mounted oscillator on the patterned metal side of said substrate, said oscillator comprising:
   amplifying means with regenerative feedback means to produce an oscillating output, said regenerative feedback means including an open-circuit-stub capacitance formed by said patterned metal layer, and
   a controllable resonant circuit coupled to said amplifying means to control the frequency at which said output oscillates, said resonant circuit including a short-circuit-stub inductance formed by said patterned metal layer, at least one varactor diode in series with said short-circuit stub, and means for applying a controllable tuning voltage to said resonant circuit.

6. The improved oscillator of claim 5 wherein capacitance values of said open-circuit stub and said varactor diodes, and an inductance value of said short-circuit stub are selected to produce a bandwidth of at least 1000 MHz within a frequency range of 1000 MHz to 2500 MHz in response to tuning voltages ranging from about about zero to about 20 volts.

7. The oscillator of claim 6, wherein said amplifying means includes a transistor, said resonant circuit includes a pair of oppositely poled varactors connected in series between the base of said transistor and said short-circuit stub, and said tuning voltage is applied to a junction between the two varactors.

8. The oscillator of claim 7, wherein an inductance of said short-circuit-stub inductance and a capacitance of said open-circuit-stub capacitance, formed by said patterned metal layer may be adjusted by varying respective lengths of said stubs.

9. A voltage-controlled oscillator circuit for operation in the microwave frequency range comprising:
   an amplifying circuit including a transistor having a collector, an emitter and a base, said emitter coupled to a common potential and to an open-circuit-stub capacitance,
   a supply voltage terminal coupled to said collector and to said base through a voltage divider network,
   a tunable tank circuit including a short-circuit-stub inductance with its output end coupled to the common potential, and a serial connection of a pair of varactor diodes with their cathode ends tied together,
   a tuning voltage supply terminal coupled to the common junction of said varactor diodes, and
   an output voltage terminal coupled to said collector for extracting the oscillating output of said oscillator,
   whereby said open-circuit stub provides a controllable regenerative feedback path for making said amplifying circuit oscillate, and said diodes and said short-circuit stub provide a means for controlling the frequency of oscillations of said oscillator.

10. The voltage-controlled oscillator of claim 9 wherein said resonant circuit is connected to said amplifying circuit through a capacitance connecting the anode of one of said varactor diodes to the base of said transistor, with the anode of the other of said varactor diodes being coupled to the input end of said short-circuit stub.

11. A TVRO receiver having a heterodyne circuit for receiving incoming TV signals in the microwave frequency range and including a VCO for generating an adjustable prescribed frequency and a mixer for combining the incoming TV signals with the output of the VCO, said VCO comprising:
   a dielectric substrate with a patterned metal layer on one side of the substrate, and
   a surface-mounted oscillator on the patterned metal side of said substrate, said oscillator comprising:
   amplifying means with regenerative feedback means to produce an oscillating output, said regenerative feedback means including an open-circuit-stub capacitance formed by said patterned metal layer, and
   a controllable resonant circuit coupled to said amplifying means to control the frequency at which said output oscillates, said resonant circuit including an inductance component, at least one varactor diode in series with said inductance component, and means for applying a controllable tuning voltage to said resonant circuit.

12. The TVRO receiver of claim 10 wherein capacitance values of said open-circuit stub and said varactor diode, and an inductance value of said inductance component are selected to produce a bandwidth of at least 1000 MHz within a frequency range of 1000 MHz to 2500 MHz in response to tuning voltages ranging from about about zero to about 20 volts.

13. The TVRO receiver of claim 12 wherein said amplifying means includes a transistor, said resonant circuit includes a pair of oppositely poled varactors connected in series between the base of said transistor and said inductance component, and said tuning voltage is applied to a junction between the two varactors.

14. The TVRO receiver of claim 13 wherein said inductance component is in the form of a short-circuit-stub inductance formed by said patterned metal layer.

15. The TVRO receiver of claim 14 wherein an inductance of said short-circuit-stub inductance and a capacitance of said open-circuit-stub capacitance, formed by said patterned metal layer may be adjusted by varying respective lengths of said stubs.

* * * * *